(12) United States Patent
Grosse et al.

(10) Patent No.: US 11,638,348 B2
(45) Date of Patent: Apr. 25, 2023

(54) PATTERNED CONDUCTIVE MICROSTRUCTURES WITHIN A HEAT SHRINKABLE SUBSTRATE

(71) Applicant: Raytheon Company, Waltham, MA (US)

(72) Inventors: Kyle L. Grosse, Dallas, TX (US); Catherine Trent, Allen, TX (US)

(73) Assignee: Raytheon Company, Waltham, MA (US)

( * ) Notice: Subject to any disclaimer, the term of this patent is extended or adjusted under 35 U.S.C. 154(b) by 163 days.

(21) Appl. No.: 16/934,951

(22) Filed: Jul. 21, 2020

(65) Prior Publication Data

US 2021/0014959 A1    Jan. 14, 2021

Related U.S. Application Data

(62) Division of application No. 16/029,507, filed on Jul. 6, 2018, now Pat. No. 10,721,815.

(51) Int. Cl.
*H05K 1/02* (2006.01)
*G03F 7/00* (2006.01)
(Continued)

(52) U.S. Cl.
CPC ........... *H05K 1/028* (2013.01); *G03F 7/0002* (2013.01); *H05K 1/0313* (2013.01); *H05K 1/09* (2013.01);
(Continued)

(58) Field of Classification Search
CPC ........ H05K 1/028; H05K 1/09; H05K 1/0284; H05K 1/0283; H05K 1/0393;
(Continued)

(56) References Cited

U.S. PATENT DOCUMENTS 4,725,478 A * 2/1988 Mathias ............... H05K 1/0313
428/209
6,247,951 B1 6/2001 Di Liello et al.
(Continued)

FOREIGN PATENT DOCUMENTS

JP    S54-22579 A    2/1979
JP    S58-7409 U    1/1983
(Continued)

OTHER PUBLICATIONS

Office Action (Notice of Reasons for Rejection) for Japan Application No. 2020-568773 dated Nov. 24, 2021, 16 pages.
(Continued)

*Primary Examiner* — Hoa C Nguyen
*Assistant Examiner* — John B Freal

(57) ABSTRACT

A conductive interconnect structure comprises a polymeric substrate (e.g., a thermoplastic) and a plurality of compliant conductive microstructures (e.g., conductive carbon nanofibers) embedded in the polymeric substrate. The microstructures can be arranged linearly or in a grid pattern. In response to heating, the polymeric substrate transitions from an unshrunk state to a shrunken state to move the microstructures closer together, thereby increasing an interconnect density of the compliant conductive microstructures. Thus, the gap or pitch between adjacent microstructures is reduced in response to heat-induced shrinkage of the polymeric substrate to generate finely-pitched microstructures that are densely pitched, thereby increasing the current-carrying capacity of the microstructures. The polymeric material can be heated to conform or form-fit to planar and non-planar surfaces/geometries, and can be selectively heated at various portions to tailor or customize the interconnect density of the microstructures at selected portions. Associated electrical conducting assemblies and methods are provided.

15 Claims, 10 Drawing Sheets

(51) Int. Cl.
*H05K 1/09* (2006.01)
*H05K 1/03* (2006.01)
*H05K 3/22* (2006.01)

(52) U.S. Cl.
CPC ..... *H05K 3/22* (2013.01); *H05K 2201/09009* (2013.01); *H05K 2201/09245* (2013.01)

(58) Field of Classification Search
CPC .......... H05K 2201/09009; H05K 2201/09245; H05K 2201/0125; H05K 2201/0129; H05K 2201/026; H05K 2201/0281; G03F 7/0002
See application file for complete search history.

(56) References Cited

U.S. PATENT DOCUMENTS

| | | | |
|---|---|---|---|
| 6,744,978 | B2 | 6/2004 | Tweedy et al. |
| 10,721,815 | B2 | 7/2020 | Grosse et al. |
| 2004/0101442 | A1 | 5/2004 | Frechet et al. |
| 2005/0235869 | A1 | 10/2005 | Cruchon-Dupeyrat et al. |
| 2008/0055581 | A1 | 3/2008 | Rogers et al. |
| 2009/0218310 | A1 | 9/2009 | Zu et al. |
| 2014/0303287 | A1 | 10/2014 | Li et al. |
| 2015/0284855 | A1* | 10/2015 | Iwashita ............ C23C 18/30 428/457 |
| 2016/0007473 | A1* | 1/2016 | Dardona ............ B29C 61/02 174/250 |
| 2016/0192501 | A1* | 6/2016 | Yan ............ H02S 50/10 29/846 |
| 2017/0232725 | A1 | 8/2017 | Lin et al. |

FOREIGN PATENT DOCUMENTS

| | | |
|---|---|---|
| JP | S61-61488 A | 3/1986 |
| JP | S62-55993 A | 3/1987 |
| JP | H02-152295 A | 6/1990 |
| JP | H04-072698 A | 3/1992 |
| JP | H11-121882 A | 4/1999 |
| JP | 2007-515076 A | 6/2007 |
| JP | 2014-123651 A | 7/2014 |
| JP | 2015-200010 A | 11/2015 |
| JP | 2018-081952 A | 5/2018 |
| KR | 10-2013-0038425 A | 4/2013 |
| WO | WO 2009/102077 A1 | 8/2009 |

OTHER PUBLICATIONS

Gunes, Analysis of Shape Memory Properties of Polyurethane Nanocomposites, Doctor of Philosophy, Polymer Engineering, Aug. 2009, 248 pages, University of Akron, Akron, Ohio.

Koerner et al., Remotely actuated polymer nanocomposites-stress-recovery of carbon-nanotube-filled thermoplastic elastomers, Nature Materials, Feb. 2004, pp. 115-120, vol. 3, Nature Publishing Group, United Kingdom.

Monkman, Advances in shape memory polymer actuation, Mechatronics, Jun. 1, 2000, pp. 489-498, vol. 10, Issues 4-5, Elsevier Science Ltd, Amsterdam.

Nguyen et al., Shrink-film microfluidic education modules: Complete devices within minutes, Biomicrofluidics, Jun. 2011, vol. 5, Issue 2, 12 pages, American Institute of Physics, College Park, Maryland.

Park et al., Highly Flexible Wrinkled Carbon Nanotube Thin Film Strain Sensor to Monitor Human Movement, Advanced Materials Technologies, May 30, 2016, 8 pages, Wiley-VCH, Germany.

Sahoo et al., Conducting Shape Memory Polyurethane-Polypyrrole Composites for an Electroactive Actuator, Macromolecular Materials and Engineering, 2005, pp. 1049-1055, vol. 290, Issue 11, John Wiley & Sons, Hoboken, New Jersey.

Trznadel et al., Thermal Shrinkage of Oriented Polymers, Journal of Macromolecular Science, 1992, pp. 259-300, vol. 32, Issue 3-4, Taylor & Francis Online, United Kingdom.

\* cited by examiner

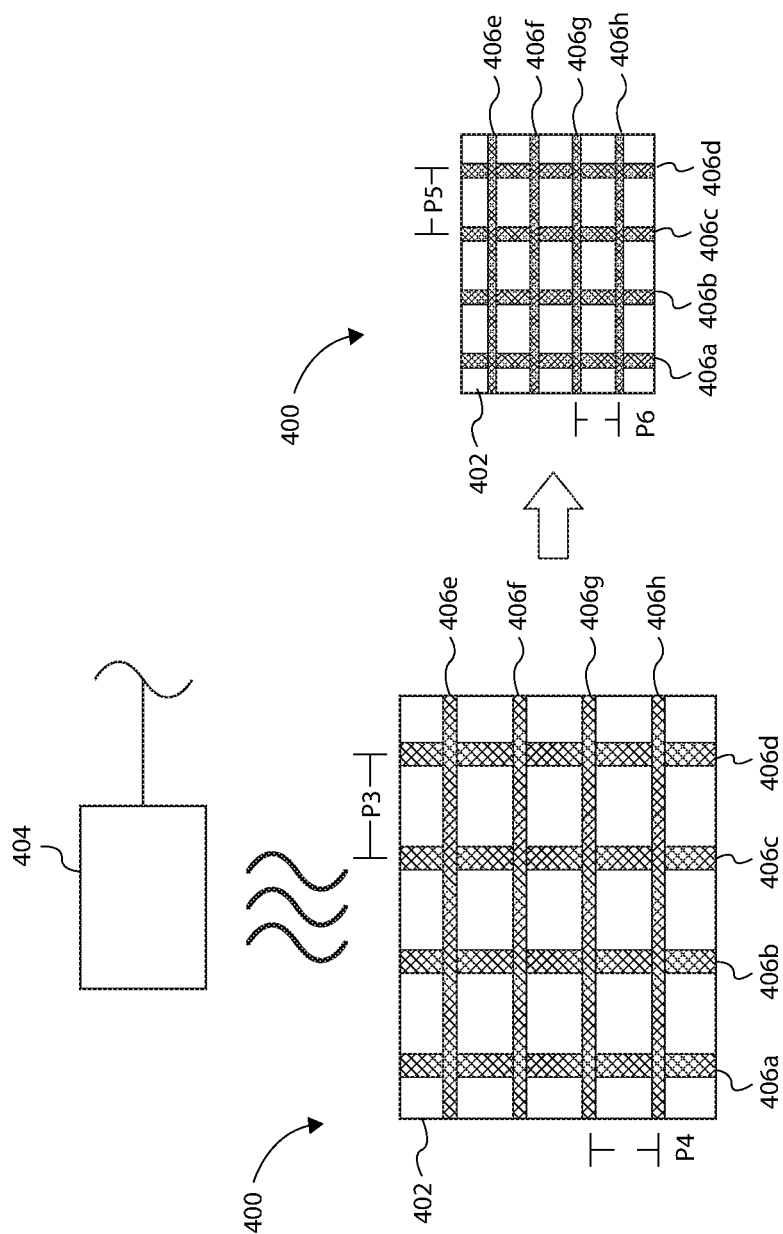

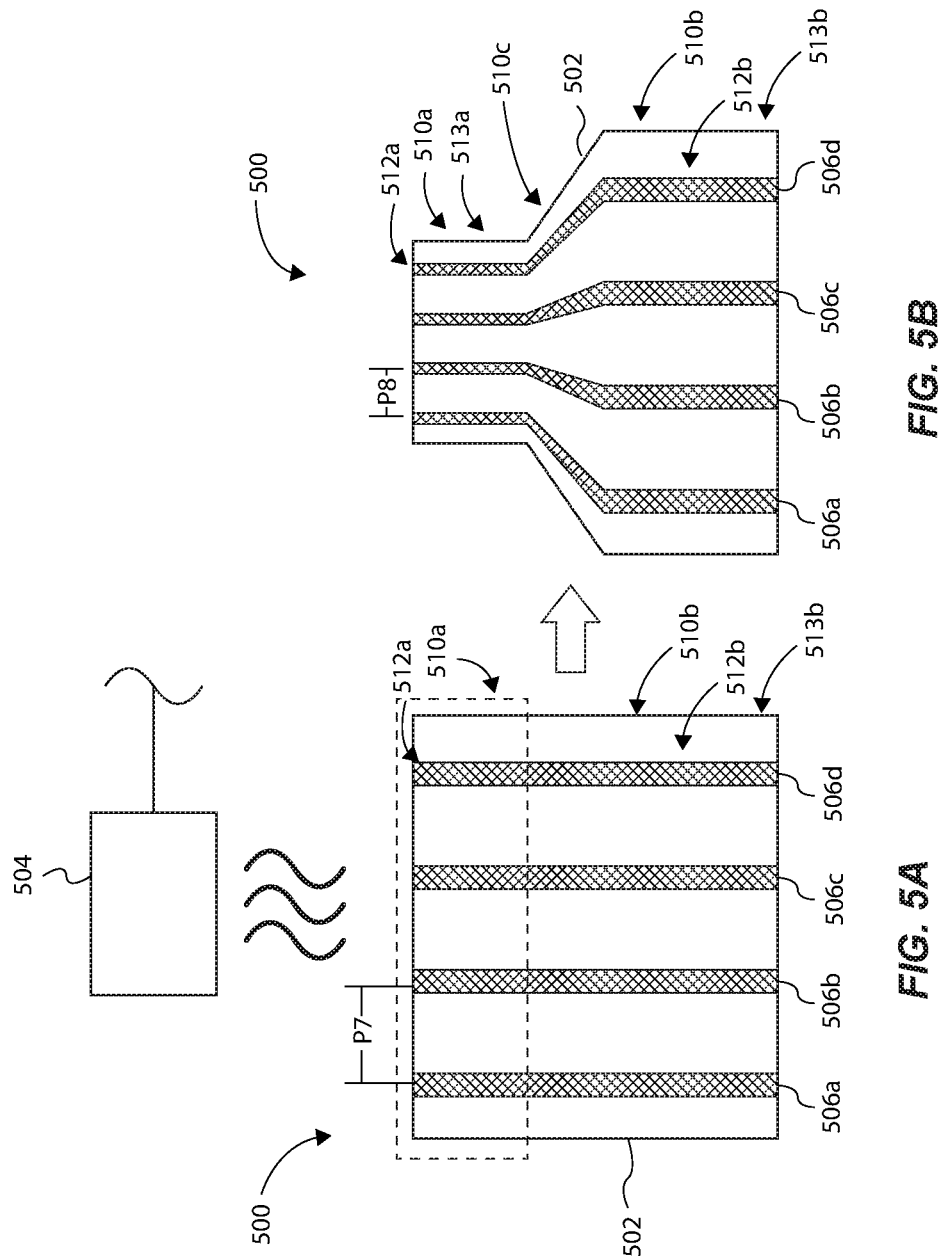

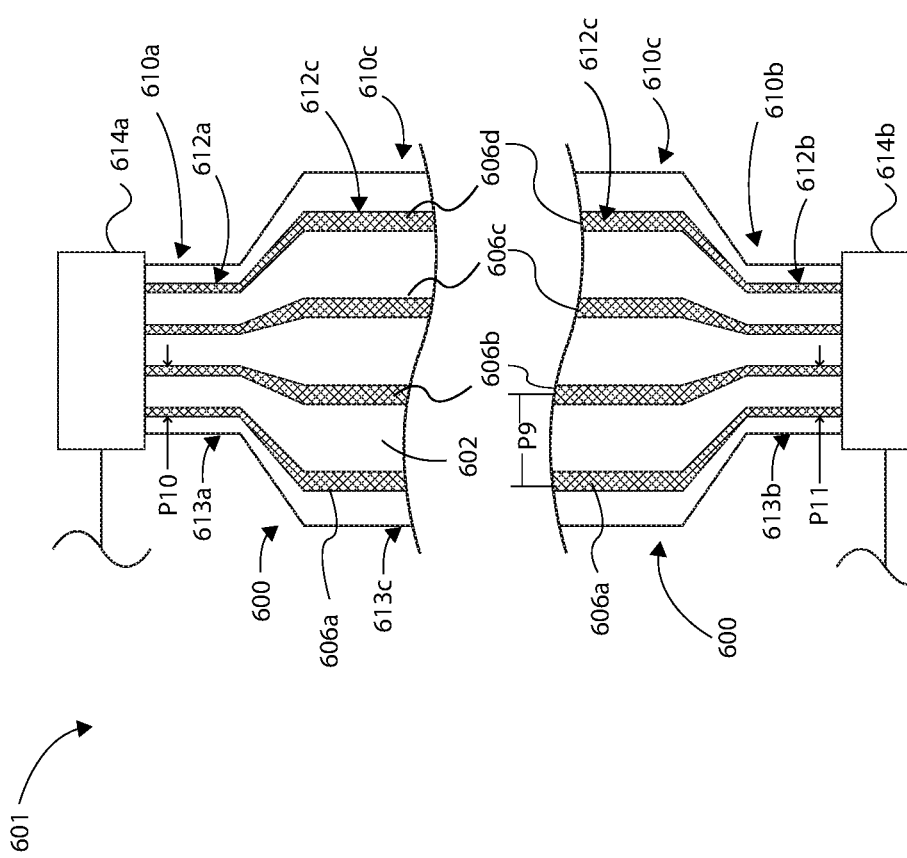

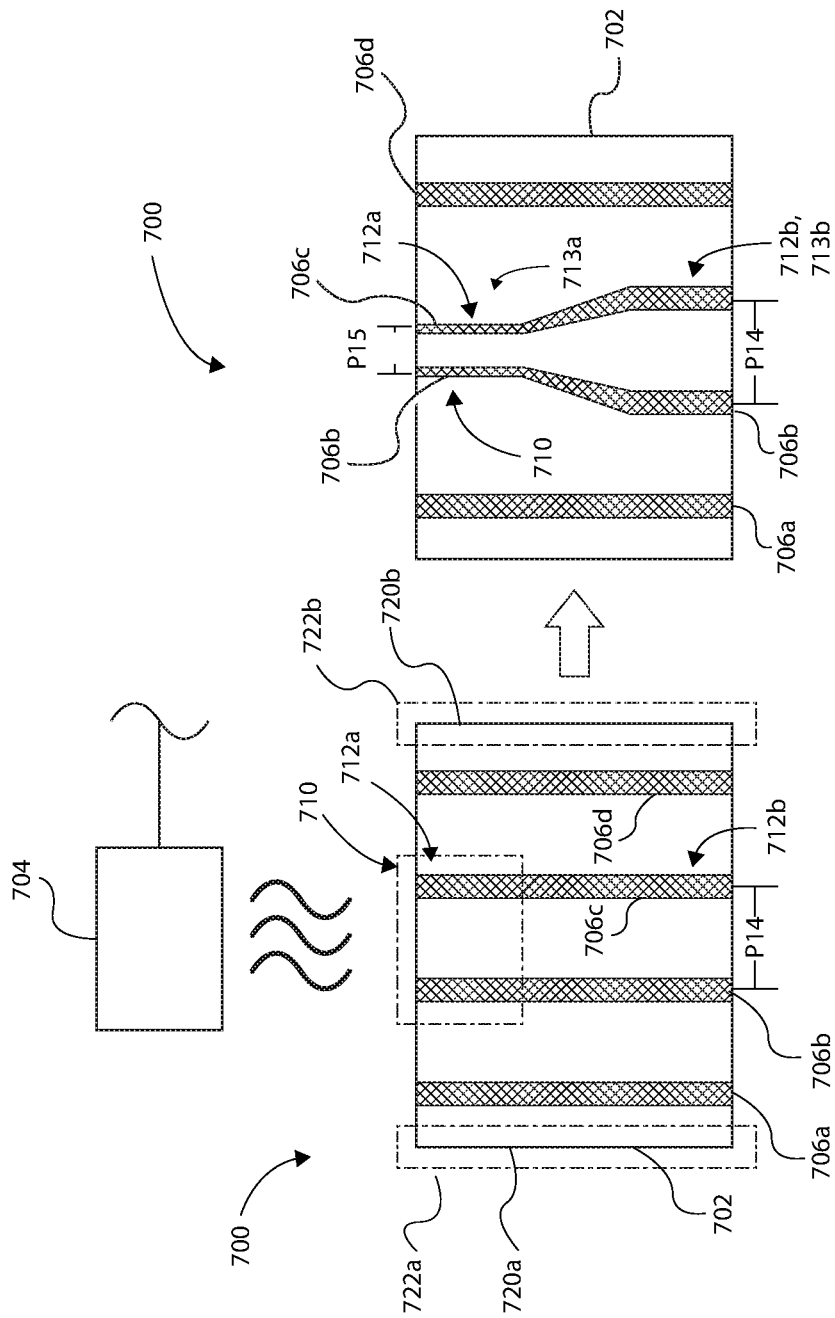

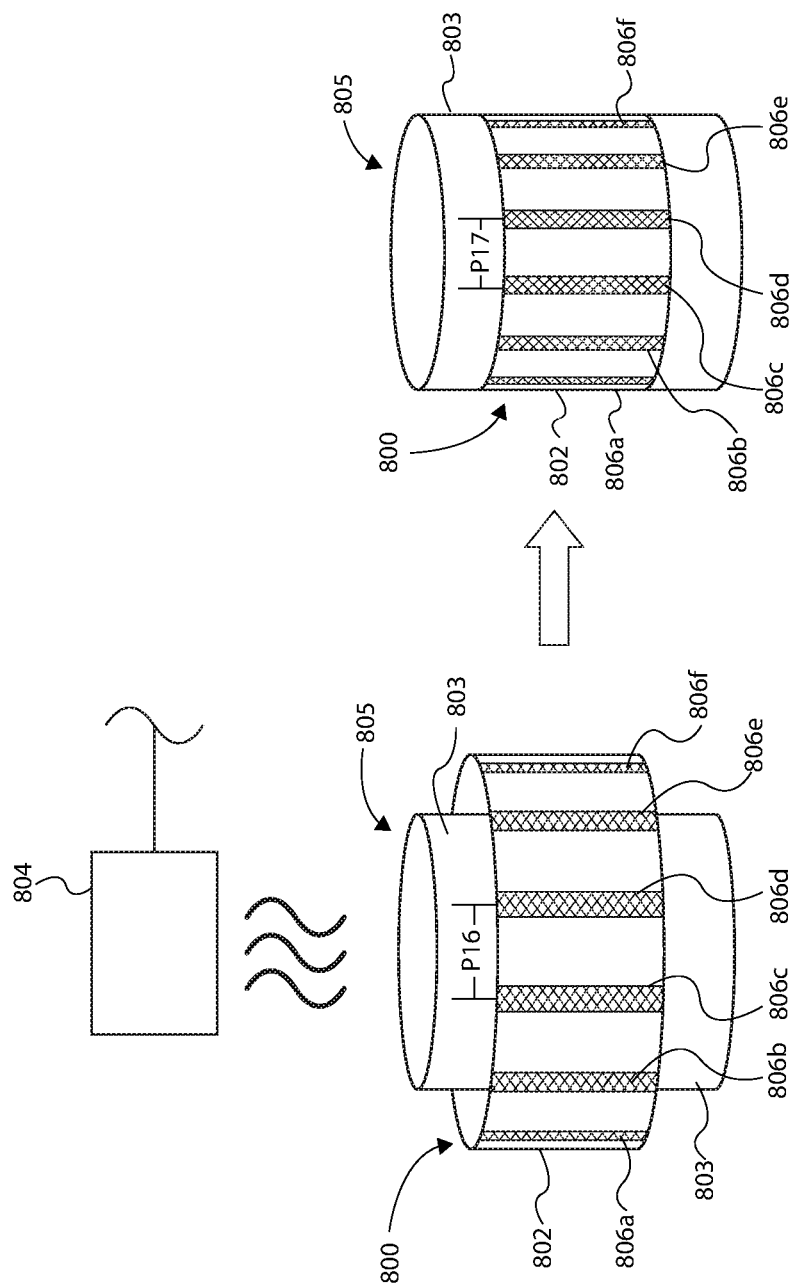

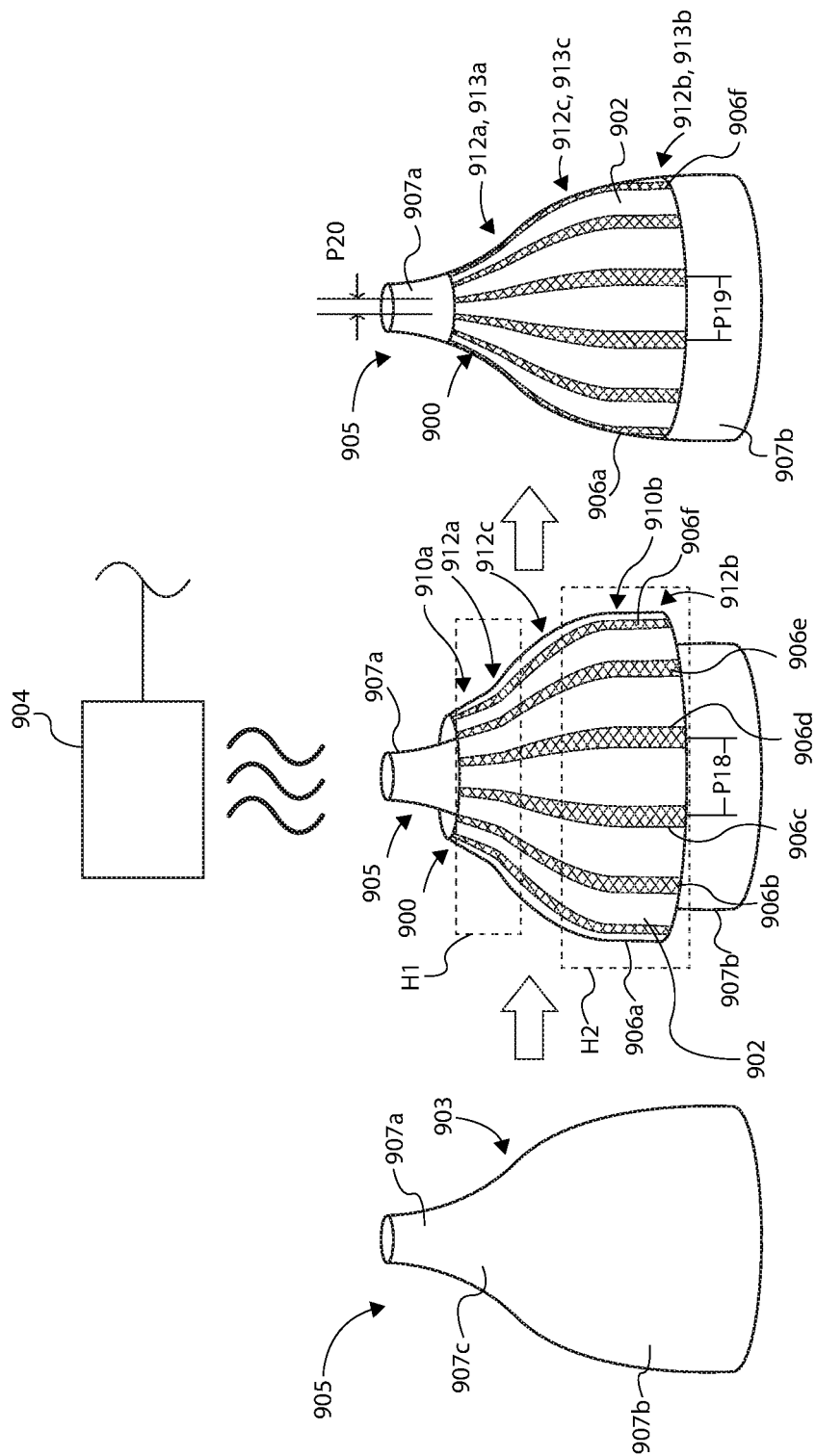

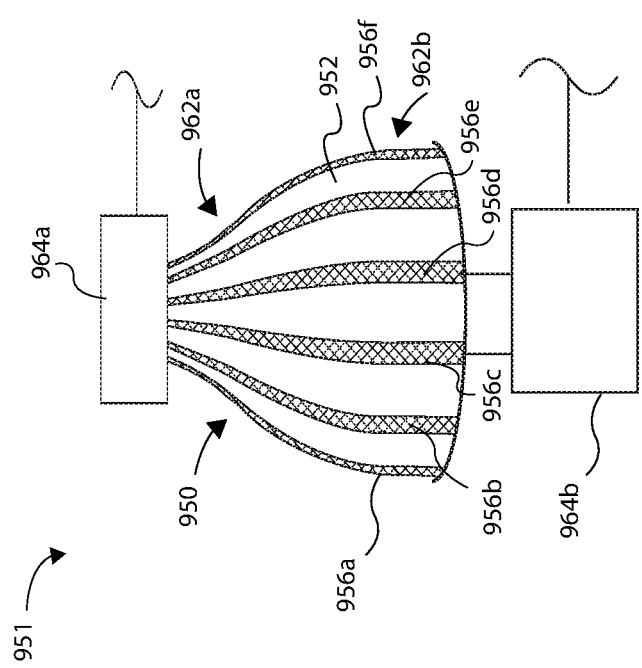

PATTERNED CONDUCTIVE MICROSTRUCTURES WITHIN A HEAT SHRINKABLE SUBSTRATE

RELATED APPLICATIONS

This is a divisional application of U.S. application Ser. No. 16/029,507, filed Jul. 6, 2018, entitled "Method of Making Patterned Conductive Microstructures within a Heat Shrinkable Substrate", which is incorporated by reference in its entirety herein.

BACKGROUND

Forming micrometer-scale conductive wires, traces, etc. to form an electrically conductive interconnect structure on a substrate poses various challenges, particularly when forming finely or densely pitched interconnect structures on non-planar surfaces, flexible bodies, etc. Traditional methods utilize photolithography processes to form such interconnect structures. However, such methods are time consuming and costly, which often renders certain applications infeasible or inefficient. Moreover, there are a limited number of substrate materials that can be utilized to form such photolithography traces or wires onto such substrate because of the structural and conductivity requirements of forming traces on such substrates.

Likewise, forming such micrometer-scale interconnect structures onto curved surfaces or curved bodies is infeasible because it is quite difficult or impossible to ensure conductivity of the structures onto a curved substrate, and thereby often cost prohibitive because of the various challenges faced with utilizing photolithography processes/tools to generate micrometer-scale interconnect structures onto a curved surface or curved body. However, a variety of applications can benefit from forming or applying finely pitched and densely pitched microstructures onto a curved surface or curved body.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIGS. 4A and 4B graphically illustrate a conductive interconnect structure and a method of making the conductive interconnect structure in accordance with an example of the present disclosure.

FIGS. 5A and 5B graphically illustrate a conductive interconnect structure and a method of making the conductive interconnect structure in accordance with an example of the present disclosure.

FIG. 6A graphically illustrates an electronics assembly having a conductive interconnect structure in accordance with an example of the present disclosure.

FIGS. 7A and 7B graphically illustrate a conductive interconnect structure and a method of making the conductive interconnect structure in accordance with an example of the present disclosure.

FIGS. 8A and 8B graphically illustrate a method of conforming or form-fitting a conductive interconnect structure to a curved surface in accordance with an example of the present disclosure.

FIGS. 9A-9C graphically illustrate a method of conforming or form-fitting a conductive interconnect structure to a double-curved surface configuration in accordance with an example of the present disclosure.

FIG. 10 graphically illustrates an electronics assembly having a conductive interconnect structure in accordance with an example of the present disclosure.

Figures 1A, 1B:
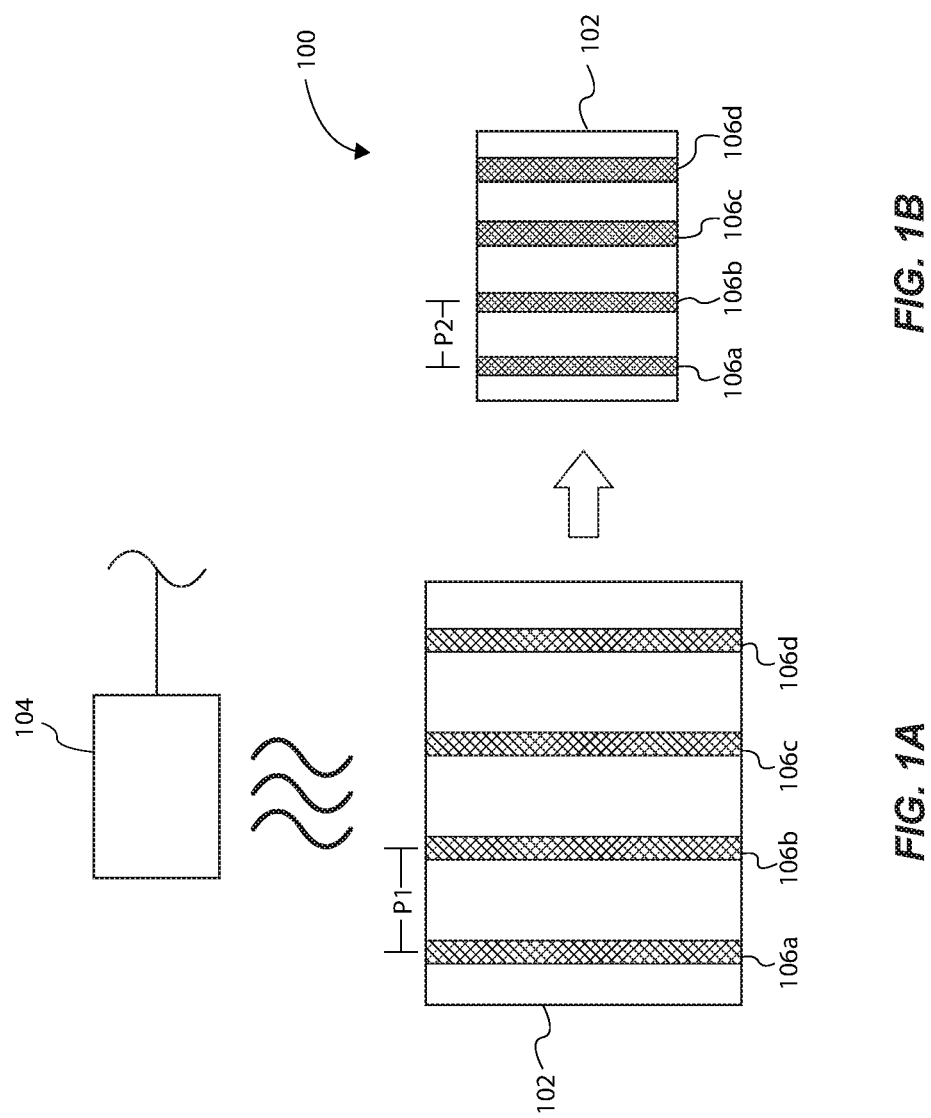
FIGS. 1A and 1B graphically illustrate a conductive interconnect structure and a method of making the conductive interconnect structure in accordance with one example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts is provided below and then specific examples are described in further detail later. This initial summary is intended to aid readers in understanding the examples more quickly, but is not intended to identify key features or essential features of the examples, nor is it intended to limit the scope of the claimed subject matter.

The present disclosure sets forth a conductive interconnect structure comprising a polymeric substrate shrinkable from an unshrunk state to a shrunken state, and a plurality of compliant conductive microstructures attached to the polymeric substrate in the unshrunk state. The compliant conductive microstructures can comprise a plurality of micro elements. In response to selective application of heat, at least a portion of the polymeric substrate transitions from the unshrunk state to the shrunken state to increase an interconnect density of the plurality of compliant conductive microstructures.

In one example, the plurality of micro elements can comprise a plurality of compliant conductive nanofibers, and the polymeric substrate can comprise a thermoplastic material.

In one example, at least some of the compliant conductive microstructures can define a first pitch when in the shrunken state, wherein, when in the unshrunk state, at least some of the compliant conductive microstructures define a second pitch, the first pitch being less than the second pitch.

In one example, an unshrunk portion of the polymeric substrate can define a first interconnect density region, and wherein a shrunk portion of the polymeric substrate can define a second interconnect density region, wherein a first section of the compliant conductive microstructures associated with the first interconnect density region extends continuously to a second section of the compliant conductive microstructures associated with the second interconnect density region.

The present disclosure sets forth an electrical conducting assembly comprising a support body comprising a support surface, and a conductive interconnect structure carried by the support body about the support surface. The conductive interconnect structure can comprise a polymeric substrate shrinkable from an unshrunk state to a shrunken state, and a plurality of compliant conductive microstructures attached to the polymeric substrate. The conductive microstructures can comprises a plurality of micro elements. Upon selective application of heat, at least a portion of the polymeric substrate transitions from the unshrunk state to the shrunken state to increase an interconnect density of the plurality of compliant conductive microstructures, thereby conforming the conductive interconnect structure to the support surface of the support body.

In one example, the plurality of compliant conductive microstructures can be arranged in a grid pattern, wherein at least a portion of the support surface comprises a curved surface.

In one example, the support body can comprise a first curved support surface and a second curved support surface. A first section of the compliant conductive microstructures can be conformed to the first curved support surface, and a second section of the compliant conductive microstructures can be conformed to the second curved support surface. The first section can comprise an interconnect density that is higher than an interconnect density of the second section.

The present disclosure further sets forth a method of locally patterning conductive microstructures embedded in a heat-induced shrinkable polymeric substrate. The method can comprise providing a conductive interconnect structure comprising a polymeric substrate and a plurality of compliant conductive microstructures embedded in the polymeric substrate, wherein the conductive microstructures can comprises a plurality of micro elements. The method can further comprise applying heat to the polymeric substrate to shrink at least a portion of the polymeric substrate to transition the portion from an unshrunk state to a shrunken state, thereby increasing an interconnect density of the plurality of compliant conductive microstructures associated with the shrunken portion of the polymeric substrate.

In one example, applying heat to the polymeric substrate can comprise applying heat to shrink a selected portion of the polymeric substrate to increase an interconnect density of the plurality of compliant conductive microstructures associated with the selected portion.

In one example, the method further comprises overlaying the conductive interconnect structure to a support body when in the unshrunk state, and applying heat to shrink at least a portion of the polymeric substrate to conform the conductive interconnect structure to the support body to increase an interconnect density of the compliant conductive microstructures.

In one example, applying heat to the polymeric substrate can comprise applying heat to shrink a first portion of the polymeric substrate to conform the first portion to a first curved surface, and can further comprise applying heat to shrink a second portion of the polymeric substrate to conform the second portion to a second curved surface.

The present disclosure still further sets forth a method of making a conductive interconnect structure comprising associating a plurality of compliant conductive microstructures with a polymeric substrate (the conductive microstructures comprising a plurality of micro elements), and applying heat to the polymeric substrate to shrink at least a portion of the polymeric substrate to transition the portion from an unshrunk state to a shrunken state, thereby increasing an interconnect density of the plurality of compliant conductive microstructures associated with the portion of the polymeric substrate.

In one example, associating the plurality of compliant conductive microstructures with the polymeric substrate can comprise embedding the compliant conductive microstructures in the polymeric substrate.

FIGS. 1A and 1B graphically illustrate a method of making a conductive interconnect structure 100 to increase an interconnect density of compliant conductive microstructures of the conductive interconnect structure 100 in accordance with one example of the present disclosure. As an overview, the conductive interconnect structure 100 can comprise a polymeric substrate 102, such as a thermoplastic (e.g., a polyethylene), that can be shrunk in response to the application of heat from a heat source 104 to transition from an unshrunk state (FIG. 1A) to a shrunken state (FIG. 1B) to increase an interconnect density of a plurality of compliant conductive microstructures 106a-d because of the compliant or flexible nature of the compliant conductive microstructures 106a-d, as further detailed below. Although compliant conductive microstructures 106a-d are shown, this is not limiting in any way as any number of microstructures can exist.

The plurality of compliant conductive microstructures 106a-d can be attached to or embedded in the polymeric substrate 102. The plurality of compliant conductive microstructures 106a-d can each comprise a collection or plurality of micro elements, such as microfibers, nanofibers, or other micro elements. The micro elements can have conductive properties, such as electrically conductive properties, optically conductive properties, thermally conductive properties, or any combination of these, for instance, thereby providing a variety of uses and applications that can utilize the compliant conductive microstructures 106a-d, as further exemplified below.

Figure 2:
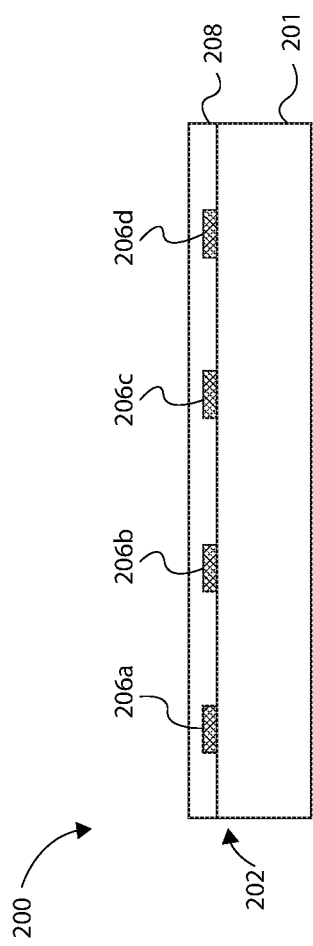
FIG. 2 graphically illustrates a cross sectioned portion of a conductive interconnect structure in accordance with an example of the present disclosure.

The plurality of compliant conductive microstructures 106a-d can be attached to the polymeric substrate 102 in a number of ways. For instance, FIG. 2 shows a lower end or side cross-sectional (graphical) view of a conductive interconnect structure 200 comprising a polymeric substrate 202 that is defined by and comprises a polymeric base substrate 201 and a polymeric film substrate 208 (e.g., both being thermoplastics). The plurality of compliant conductive microstructures 206a-d can be sandwiched between or otherwise positioned generally between the polymeric film substrate 208 and polymeric base substrate 201. In one example of making the conductive interconnect structure 200 (as well as the conductive interconnect structure 100), prior to shrinking the polymeric substrate 202, the compliant conductive microstructures 206a-d can be overlaid onto the polymeric base substrate 201, and then the polymeric film 208 can then be overlaid onto the compliant conductive microstructures 206a-d. An amount of heat can be applied to the polymeric film 208 and the polymeric layer 201 (e.g., between heated platens) sufficient to reflow them together, thereby attaching or embedding the compliant conductive microstructures 206a-d in the polymeric substrate 202, thereby forming the conductive interconnect structure 200.

Figure 3:
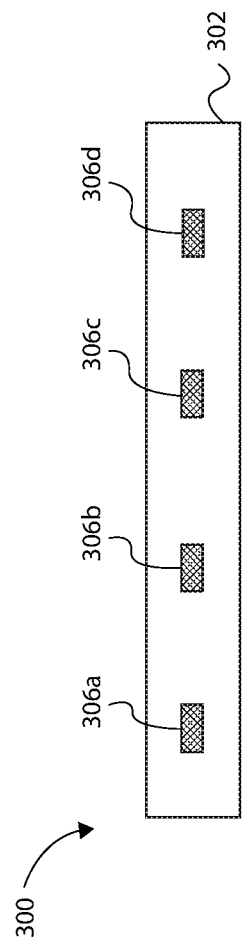
FIG. 3 graphically illustrates a cross sectioned portion of a conductive interconnect structure in accordance with an example of the present disclosure.

Once formed, the conductive interconnect structure 200 will appear and take on a configuration similar to that of the conductive interconnect structure 300 shown in FIG. 3, because the polymeric film 208 and the polymeric layer 201 are now fused or reflowed together to form a unitary polymeric substrate, wherein the compliant conductive microstructures 206a-d are encased or embedded therein. Note that the non-unitary polymeric substrate 202 may be a very thin (e.g., 1 mm or less) flexible film or coating that can be wrapped around, or draped, or overlaid, or otherwise applied to a number of different surfaces, structures, shapes, and the like, and that can be heated to shrink to fit (or shrink wrap) around a variety of surfaces, as further exemplified herein. In some examples, the polymeric substrate 202 can be transparent, semi-transparent, or opaque.

FIG. 3 illustrates a lower end or side cross-sectional (graphical) view of a conductive interconnect structure 300 comprising a unitary polymeric substrate 302 and a plurality of compliant conductive microstructures 306a-d attached to or embedded in the polymeric substrate 302. In one example of making the conductive interconnect structure 300 (prior to shrinking the polymeric substrate), the plurality of compliant conductive microstructures 306a-d can be suspended or positioned in a mold or basin, and then a polymeric substrate material can be flowed into the mold and around the plurality of compliant conductive microstructures 306a-d, thereby generating the conductive interconnect structure 300, which is then ready to be heated to shrink the polymeric substrate 302, as further exemplified herein. In another example, a conductive interconnect structure can be formed by embossing a plurality of compliant conductive microstructures into a polymeric substrate by heating the compliant conductive microstructures (and/or substrate), and then slicing the compliant conductive microstructures into the polymeric substrate. The polymeric substrate can then be heated and reflowed around the compliant conductive microstructures.

The compliant conductive microstructures discussed in the various examples of the present disclosure can be pre-formed prior to being attached to or embedded in a particular polymeric substrate. For instance, electrospinning techniques can be utilized to spin or fabricate a plurality of micro elements to form one particular compliant conductive microstructures, such as spinning carbon nanotubes, for instance, in a desired pattern, shape, and size (e.g., linear, radial, grid, etc.). Other known techniques of making conductive microstructures having micro elements such as nanofibers can be utilized to form one or more compliant conductive microstructures. In one example, a particular compliant conductive microstructure can be electro spun to mimic or duplicate the shape of a traditional trace (e.g., linear) used in semiconductor or other microstructure applications.

With continued reference to FIGS. 1A and 1B, when in the unshrunk state of FIG. 1A the plurality of compliant conductive microstructures 106a-d can define an interconnect density defined by a first pitch P1, where a "pitch" can be defined as the distance between adjacent compliant conductive microstructures 106a-d. The term "interconnect density" is related to the amount of compliant conductive microstructures supported about a given area or size of the supporting substrate (e.g., the x and y area or 2D space), and such interconnect density is correlated to the relative pitch between adjacent compliant conductive microstructures. Thus, in one example, a plurality of microstructures (e.g., wires, traces, contacts, etc.) with fine individual widths of less than 10 microns, such as 4 microns or less, arranged to have a pitch of 70 microns (or less), for example. These can be even more finely pitched by utilizing the same microstructures with a smaller pitch than 70 microns, such as a pitch of 10 microns or less between adjacent microstructures. Thus, in a specific example, using two samples with similar microstructures of a different pitch, the first (70 micron sample) has one interconnect density, while the second (10 micron sample) has a different interconnect density due to the lower pitch between adjacent microstructures per area of the substrate.

Increasing or altering an interconnect density from one interconnect density (e.g., 200 microns and above) to a different density (e.g., 70 microns or less) in this manner decreases the gap or pitch between the microstructures, which thereby increases the current-carrying capacity by increasing the amount of the conductive microstructures in a given area or "real estate" (e.g., 2D space) used by the microstructures as supported by a particular polymeric substrate. In this specific example, the interconnect density of the microstructures has increased while the pitch decreased from about 200 microns to about 70 microns between adjacent microstructures.

The various examples discussed herein are capable of achieving this because of the operations of heating at least a portion of a polymeric substrate to shrink its size, which causes the compliant conductive microstructures to move closer together while shrinking the pitch between individual adjacent compliant conductive microstructures, as further detailed throughout the present disclosure. This also decreases sheet resistance of metallic or semi-metallic grids or patterns without the use of photolithography processes if the individual micro and/or nanostructures are conductive. Note that the particular compliant conductive microstructures of a given structure can be both microstructures and nanostructures.

With this in mind, in one specific example the first pitch P1 (defined as the distance between adjacent compliant conductive microstructures 106a-d (as measured from the center of the microstructures)) can be approximately 200 microns as arranged on the unshrunk polymeric substrate 102 (FIG. 1A). In this manner, the compliant conductive microstructures 106a-d define a known first interconnect density as supported by the polymeric substrate 102. Note that the plurality of compliant conductive microstructures 106a-d can be arranged generally linearly and can be spatially separated from each other, as shown, although other configurations or layouts are contemplated, as further detailed in other examples below (e.g., see FIG. 4A and its accompanying description).

Because the polymeric substrate 102 is shrinkable to a certain known degree in response to the selective application of heat from the heat source 104, the polymeric substrate 102 can be heated to a sufficient and select temperature and duration to shrink the polymeric substrate 102 to at least half its original size and shape (e.g., "2× shrinkage" or more). In some cases, a particular polymeric substrate can be selected of a thermoplastic material, for instance, that can be shrunk up to a twentieth of its original size and shape depending on the material used.

Notably, as the polymeric substrate 102 is heated and shrunken to a desired size, the compliant conductive microstructures 106a-d can concurrently move closer together as the supporting polymeric substrate 102 is shrunken to reduce the pitch between adjacent compliant conductive microstructures 106a-d, thereby increasing the interconnect density of the compliant conductive microstructures 106a-d. In some examples, this also reduces the individual width of each compliant conductive microstructures 106a-d due to the strain imparted laterally to the compliant conductive microstructures 106a-d upon shrinkage of the polymeric substrate 102. However, in other examples, the individual widths of each compliant conductive microstructure may not change, depending upon the makeup of the compliant conducting microstructure, such as illustrated in FIGS. 1A and 1B. This "increased interconnect density" can be achieved without breaking, cracking, warping, bucking, or other undesired distortion of the compliant conductive microstructure 106a-d upon shrinking the polymeric substrate 102. This is because each compliant conductive microstructures 106a-d is specifically and strategically configured to be compliant or flexible to some degree, due to the individual micro elements (e.g., carbon nanofibers) of each conductive microstructure and the interrelation of these to one another being such that they can move relative to each other (e.g., longitudinally) so as to provide the conductive microstructures with compliant properties. This also ensures that the conductive microstructures will not undergo buckling or cracking as the "shrinking" of the polymeric substrate 102 imparts strain and other forces to each of the compliant conductive microstructures 106a-d.

In a specific example, the micro elements of the compliant conductive microstructures 106a-d can be a plurality or collection of nanofibers or nanotubes that are held together via "Van der Waal" forces. Because of this, upon being strained due to the shrinkage of the polymeric substrate 102, the carbon nanofibers of a particular conductive microstructure 106 can somewhat slide or move relative to adjacent/interfaced nanofibers. Because nanofibers are somewhat loosely, molecularly bounded together when arranged longitudinally as a strip of material or as a trace microstructure, the individual nanofibers are caused to slip or move relative to each other (e.g., longitudinally) while the polymeric substrate 102 is being shrunk, all without affecting the lateral strength of the bond between interfaced nanofibers. In other words, they are free to undergo linear or longitudinal motion without affecting the lateral strength of the overall microstructure. Such movement is somewhat analogous to how strands of a nylon rope slip or slide relative to each other when strained in a number of directions (e.g., longitudinally, laterally, radially) because of the compliant nature of the rope and because of the "loosely" interfaced strands or fibers of the rope.

In one example, the nanofibers can be carbon nanofibers that have been doped with an electrically conductive material, such as a sliver metal, to provide a certain, predicable amount of electrical conductivity. Other materials, such as gold, acid, etc., can be used to dope the carbon nanofibers to improve or tailor the conductivity. In other examples, the compliant conductive microstructures 106a-d can be electrically conductive microfibers or micro tubes, or even larger elements such as metal wires in the millimeter scale. However, the larger the wires or fibers, the more likely such wires will buckle or crack when shrinking the polymeric substrate 102, because such larger wires or fibers are more susceptible to this due to the inherent nature of moving such larger wires when shrinking the polymer attached thereto. Thus, in the example of carbon nanofibers, it is less likely that they will buckle because of the aforementioned inherent properties of nanofibers being slidable or movable relative to each other.

In response to applying heat to the entire polymeric substrate 102 in the example of FIG. 1A, the polymeric substrate 102 will uniformly shrink and set to a final shape and size that may be half its original size (or even up to a twentieth of its original size) depending on the polymeric material used for the polymeric substrate, and the amount and duration of heat applied. Thus, the shrinkage or strain of the polymeric material 102 can be varied as needed or desired, and causes the compliant conductive microstructures 106a-d to move closer together corresponding to the amount of shrinkage of the polymeric material 102. Once shrunken and set, the interconnect density of the compliant conductive microstructures 106a-d has therefore been increased as compared to the interconnect density prior to shrinking, thereby generating or forming a second pitch P2 that is less than the first pitch P1.

Further to a particular example, assume that a final/desired pitch of 70 microns is required for a particular connection to an electronics connector or device. Based on this, a particular polymeric substrate can be selected that is capable of shrinking to three times its original size, so that the compliant conductive microstructures 106a-d can be embedded in the polymeric substrate to have a gap or pitch between each other (e.g., the first pitch P1) being initially about 210 microns. In response to uniformly heating the polymeric material 102 to shrink to three times its original size, the compliant conductive microstructures 106a-d will move closer together to reduce the gap or pitch by the same 3× reduction or shrinkage factor. The result is that the second pitch (e.g., P2) would be set at approximately 70 microns, thereby meeting the requirements to connect the resulting finely-pitched microstructures, having a high-density pitch, to an electronics connector or device.

In other examples, the second pitch P2 can be reduced down to 50 microns, or even down to 10 microns in some examples where the polymeric material is selected to shrink to a tenth or twentieth its original size. This is one example and meaning of "high-density" or "high-interconnect density", namely that the compliant conductive microstructures 106a-d have a pitch of approximately 70 microns or less, or even approximately 10 microns. This is not possible to achieve with existing methods of forming conductive traces about a traditional substrate, such as generated with traditional photolithography methods and devices, particularly with form fitting a structure to a non-planar surface at such high interconnect density. Thus, the compliant conductive microstructures 106a-d can have very fine pitches (e.g., 70 to 10 microns) between each other without risking the likelihood of buckling or cracking while the polymeric substrate is shrunk, which provides a high-density interconnect structure capable of transferring electrical energy and/or thermal energy at a much higher density as compared to conductive traces with a larger pitch (low density) formed via photolithography, for instance.

Notably, the use of photolithography processes to form such finely pitched, high-density interconnect structures on a plastic or polymer substrate is not effective and not feasible because of the naturally generated very rough microscopic surfaces or contours about a surface of such polymer substrates. Thus, forming "photolithography-generate traces" on a polymeric substrate results in the traces being un-usable because of the lack of connectivity that would result when forming traces on such a rough polymeric substrate.

Utilizing optically transparent thermopolymers to form the interconnect structure examples described herein enables the creation of transparent and highly-conductive surfaces when forming a high interconnect density (e.g., a 4 micron pitch), as further described above.

In one example, the polymeric substrate 102 (e.g., being flexible) can be wrapped around or interfaced to a flexible support surface, such as a flexible fabric wearable by a user, or a flexible fabric attached to a structure such as a helmet, vehicle, etc. The polymeric substrate 102 can be heated and shrunk to form-fit and attach to the fabric material. In this manner, the compliant conductive microstructures 106*a-d* supported by the polymeric substrate 102 can be electrically coupled to an electrical power source (e.g., a battery or other power source) for transferring thermal energy to the fabric, and ultimately to a structure and/or person. The compliant conductive microstructures 106*a-d* can also be used on a fabric for transferring electrical signals to electrical components (e.g., to LEDs, sensors, etc.) supported by the wearable fabric. As an example, a portion of the wearable fabric may require greater thermal energy than other areas, such as near the torso, extremities, etc., and therefore would benefit from a higher density of compliant conductive microstructures at such locations. As further detailed below regarding FIGS. 5A and 7A, the compliant conductive microstructures could be tailored to be more dense about a polymeric substrate by selectively heating at least a portion of the polymeric substrate, thereby generating a more densely pitched and finely pitched compliant conductive microstructures at such select locations. This can be useful in the example above where more thermal energy is required at particular locations of a fabric substrate.

As another example, the conductive interconnect structure 100 can provide a certain amount of structural integrity to a structure that it is attached to (e.g., a glass surface, an electronics component, etc.) because the compliant conductive microstructures 106*a-d* (e.g., having carbon nanofibers) are more closely arranged together or more densely pitched together than that is possible with existing methods of forming metallic or conductive traces on a support surface, which improves or maximizes the structural integrity of a particular surface or assembly. And, a shrunken polymeric material is now structurally stronger than prior to shrinking because of the inherent strengthening of a thermoplastic material, for instance, when it is shrunken and cooled, which alters the material properties across a surface of the conductive interconnect structure, thereby providing further structural integrity of the conductive interconnect structure and/or the assembly attached thereto.

FIGS. 4A and 4B graphically illustrate a method of making a conductive interconnect structure 400 to increase an interconnect density of compliant conductive microstructures of the conductive interconnect structure 400 in accordance with an example of the present disclosure. The conductive interconnect structure 400 can comprise a polymeric substrate 402 that can be shrunk to transition from an unshrunk state (FIG. 4A) to a shrunken state (FIG. 4B) in response to the application of heat from a heat source 104. The conductive interconnect structure 400 can comprise a plurality of compliant conductive microstructures 406*a-h* formed in a grid pattern and attached to or embedded in the polymeric substrate 402. The compliant conductive microstructures 406*a-h* can be embedded in the polymeric substrate 402 in a manner such as described above. The plurality of compliant conductive microstructures 406*a-h* can each comprise a plurality of micro elements, such as micro fibers and/or nanofibers, such as carbon nanotubes having electrically conductive properties, as further discussed above.

When in the unshrunk state of FIG. 4A, the plurality of compliant conductive microstructures 406*a-d* can define an interconnect density (both vertically and horizontally) because of the lattice pattern of the grid, and therefore the compliant conductive microstructures 406*a-d* can be separated from each other in one direction by a first pitch P3, while the compliant conductive microstructures 406*e-h* can be separated from each other by a second pitch P4 (which can be the same or different from the first pitch P3). The first and second pitches P3 and P4 can be relatively large (e.g., 200 microns or more), and can therefore define a low-density of the compliant conductive microstructures 406*a-h*. The plurality of compliant conductive microstructures 406*a-h* can be arranged in the orthogonal or lattice grid pattern shown, although other grid patterns, layouts, and spacing arrangements are contemplated herein, such as a diamond shaped grid pattern, or non-linear or non-uniform grid patterns, or even a radially arranged grid pattern.

Similarly as described above regarding FIGS. 1A and 1B, because the polymeric substrate 402 is shrinkable to a certain amount or degree in response to the application or induction of heat from the heat source 404, the polymeric substrate 402 can shrink to at least half its original size and shape (or even up to a twentieth its original size and shape depending on the polymeric material used, and the magnitude and duration of heat applied). Notably, as the polymeric substrate 402 is heated and shrunken to a desired size and shape, the compliant conductive microstructures 406*a-h* can concurrently move closer together to increase the interconnect density(ies) without the grid of compliant conductive microstructures 406*a-h* breaking, cracking, warping, buckling, or undergoing other undesired distortion. This is because the compliant conductive microstructures 406*a-h* can comprise a plurality of micro elements that can be a plurality or collection of nanofibers that are compliant in nature so that, upon being subjected to forces due to the shrinkage of the polymeric substrate 402, the nanofibers can slide or move relative to interfaced nanofibers or nanotubes, while overlapping conductive microstructures 406*a-h* about the grid pattern can also slide or move relative to each other while being strained upon shrinkage of the polymeric substrate 402 without breaking or buckling sections of the grid pattern, similarly as described regarding the compliant conductive microstructures 106*a-d* regarding FIGS. 1A and 1B.

Therefore, in response to applying heat (e.g., uniformly) to the polymeric substrate 402 in the example of FIG. 4A, the polymeric substrate 402 will shrink and set to a final shape and size that may be at least half its original size (and up to a twentieth of its original size), such that the compliant conductive microstructures 406*a-h* move closer together relative to each other, thereby increasing the interconnect density(ies) of the compliant conductive microstructures 406*a-h*. Thus, third and fourth pitches P5 and P6 (FIG. 4B) (e.g., 70 microns or less) are each less than each of the first and second pitches P3 and P4 (FIG. 4A) (e.g., 200+ microns). Note that the starting pitch (prior to shrinking) can be approximately 200 microns, and in some cases can be approximately 50 microns prior to shrinking.

The resulting conductive interconnect structure 400 of FIG. 4B can be advantageous in applications that can benefit from the transfer of thermal energy, for instance, because the grid pattern can be thermally conductive to warm or heat a surface or structure, such as a flexible conductive substrate assembly worn by a user for warming purposes (as noted above), or as applied to a glass surface that can benefit from a high-density heating application. In any of the examples discussed herein, the polymeric substrate 402 can be shrunk uniformly or non-uniformly. For instance, if it is known that ice builds-up to a greater amount at a particular location on a glass window, the grid pattern (or linear pattern) of compliant conductive microstructures can be generated to be denser in the (transparent) conductive interconnect structure applied to the glass at such particular location via selective heating of a particular location of the polymeric substrate (i.e., non-uniformly heating the polymeric substrate to shrink a specific area or region to a greater degree relative to another region) to tailor or customize the final pattern or density of the compliant conductive microstructures along a particular structure or surface, thereby generating greater thermal energy at the particular location to melt the ice, for instance. Such "selective heating" of a particular portion of a polymeric substrate will be further exemplified below, and can be applied similarly to the grid pattern of the compliant conductive microstructures 406a-h of FIGS. 4A and 4B.

FIGS. 5A and 5B graphically illustrate a method of making a conductive interconnect structure 500 to increase an interconnect density of compliant conductive microstructures of the conductive interconnect structure 500 in accordance with one example of the present disclosure. The conductive interconnect structure 500 can comprise a polymeric substrate 502 shrinkable to transition from an unshrunk state (FIG. 5A) to a shrunken state (FIG. 5B) in response to the application of heat from a heat source 504. The conductive interconnect structure 500 can comprise a plurality of compliant conductive microstructures 506a-d attached to or embedded in the polymeric substrate 502 (e.g., as described above). The plurality of compliant conductive microstructures 506a-d can each be formed and have the same properties described with other compliant conductive microstructures discussed herein (e.g., micro elements comprised of carbon nanofibers).

When in the unshrunk state of FIG. 5A, the plurality of compliant conductive microstructures 506a-d can define an interconnect density defined by a first pitch P7 between adjacent compliant conductive microstructures 506a-d. Similarly as described regarding FIGS. 1A and 1B, because the polymeric substrate 502 is shrinkable to a certain degree in response to the application of heat from a heat source 504, a selected portion 510a of the polymeric substrate 502 can be heated (to a selected temperature and duration) to shrink that portion to at least half its original size and shape (or up to a twentieth its original size and shape). Meanwhile, an unshrunk portion 510b of the polymeric substrate 502 is not heated, and therefore does not shrink (i.e., the polymeric substrate 502 is non-uniformly heated). Thus, as the selected portion 510a is heated and shrunken, only the upper sections 512a of the compliant conductive microstructures 506a-d move closer together relative to each other, thereby defining a first interconnect density region 513a shown in FIG. 5B. As a result, the compliant conductive microstructures 506a-d of the upper section 512a define a second pitch P8 (e.g., 70 microns or less) that is less than the first pitch P7 (e.g., 200+ microns). This is one example of incorporating non-uniform heating processes to tailor a particular section(s) of a conductive interconnect structure 500, thereby forming a customized or tailored interconnect density or density region associated with the compliant conductive microstructures 506a-d as supported by the polymeric substrate 502.

The resulting conductive interconnect structure 500 of FIG. 5B can be somewhat flared outwardly from the first portion 510a to the second portion 510b, such that a lower section 512b of the compliant conductive microstructures 506a-d is unaffected in pitch (e.g., the lower section 512b still comprising the first pitch P7), with the upper section 512a of the compliant conductive microstructures 506a-d are more finely and more densely pitched than that of the lower section 512b.

Notably, the conductive interconnect structure 500 can define a first interconnect density region 513a and a second interconnect density region 513b having a different interconnect density than the first interconnect density region 513b (as well as a transition region or portion 510c between these). As shown, the lower section 512b of the compliant conductive microstructures 506a-d transitions from one interconnect density toward the upper section 512a having a different interconnect density, and transitions in a continuous manner so that there are no breaks or splices from one end of the compliant conductive microstructures 506a-d to the other end. This helps to reduce losses, meet impedance requirements, and reduce the complexity of fabricating an interconnect structure having two sets of interconnect density regions, but only one set of compliant conductive microstructures 506a-d that extend continuously therebetween.

Although FIG. 5B shows a flared transition portion 510c extending between portions 510a and 510b formed in a linear manner for purposes of illustration, in practice such transition area may curved or curvilinear because of the inherency of the polymeric substrate 502 deforming in response to applying heat to only a section of the polymeric substrate 502.

The conductive interconnect structure 500 of FIG. 5B can be used as electrically conductive cable lines, such as a flexible ribbon cable or BUS lines that are used widely in electronic assemblies. For instance, the upper section 512a of the compliant conductive microstructures 506a-d can be electrically and mechanically coupled to an electrical connector or electronics component, such as a processor, while the lower section 512b can be electrically and mechanically coupled to at least one electrical component, such as to back-end electrical components (e.g., power supply, larger electronics components, memory devices, etc.), as further exemplified below.

FIG. 6A shows an example of an electrically conducting assembly 601 that can utilize the structure and operations discussed regarding the conductive interconnect structure 500 of FIG. 5B. Here, the electronics assembly 601 can comprise a conductive interconnect structure 600 that comprises a polymeric substrate 602 that has been heated/shrunk at a first end portion 610a and at an opposing second end portion 610b, while a middle portion 610c (between end portions 610a and 610b) has not been heated/shrunk (or may be shrunken to a lesser degree than the end portions). As shown, the conductive interconnect structure 600 can comprise a plurality of compliant conductive microstructures 606a-d attached to the polymeric substrate 602, which can have the same micro elements exemplified herein.

In this example, a middle section 612c of the conductive structures 606a-d (associated with the middle portion 610c of the polymeric substrate 602) can define a first interconnect density defined by a first pitch P9 (unshrunk area), while an upper section 612a of the compliant conductive structures 606a-d (at the first end portion 610a) can define a second interconnect density defined by a second pitch P10. Accordingly, the conductive interconnect structure 600 can comprise a first density region 613a, a second density region 613b, and a third density region 613c, as labeled and associated with respective sections 612a-c of the compliant conductive structures 606a-d.

The first end portion 610a can be mechanically coupled to a first electronics component 614a (or pinned to an electrical connector) while the first section 612a of the compliant conductive structures 606a-d can be electrically coupled to the first electronics component 614a. On the other side, a lower section 612b of the compliant conductive structures 606a-d (at the second end portion 610b of the polymeric substrate 602) defines a third interconnect density (the same or different from the first interconnect density) defined by a third pitch P11. The second end portion 610b can be mechanically coupled to a second electronics component 614b (or connector), while the lower section 612b of the compliant conductive structures 606a-d can be electrically coupled to the second electronics component 614b. Thus, the second and third interconnect density regions 613a and 613b can each define an interconnect density that is higher or greater than an interconnect density defined by the third interconnect density region 613c. A "higher" or "greater" interconnect density means that the compliant conductive structures are closer together in pitch (e.g., 70 microns or less), as compared to the pitch of the compliant conductive structures prior to shrinking the polymeric substrate (or as compared to those portions not shrunk as much). And, as shown, the compliant conductive structures 606a-d can extend through each of the first, second, and third interconnect density regions 613a-c in a continuous manner without breaks, splices, or other transitions, which provides the advantages discussed herein.

Therefore, opposing ends of the conductive interconnect structure 600 can be considered high-density microstructures that are finely pitched electrically conductive microstructures defining the first and second sections 612a and 612b. Such first and second sections 612a and 612b are each flared outwardly toward each other and transition or extend to the middle section 612c of the compliant conductive structures 606a-d. This is achieved by selectively heating only the end portions 610a and 610b of the polymeric substrate 602, similarly as described regarding FIGS. 5A and 5B, while not heating the middle portion 610c (or not heating the middle portion as much or to the same extent). In the example where the conductive interconnect structure 600 comprises an electrically conductive cable line, such as a ribbon cable or a flexible BUS line, the middle portion 612c can be folded or wrapped about itself, or even wrapped around a structure of an electronics assembly that supports the first and second electronics components 614a and 614b. This can reduce or minimize the space of the electronics assembly, because of the conductive structures 606a-d being densely pitched at ends, and because of the middle portion 612c being capable of wrapping around itself and/or other components.

Figure 6B:
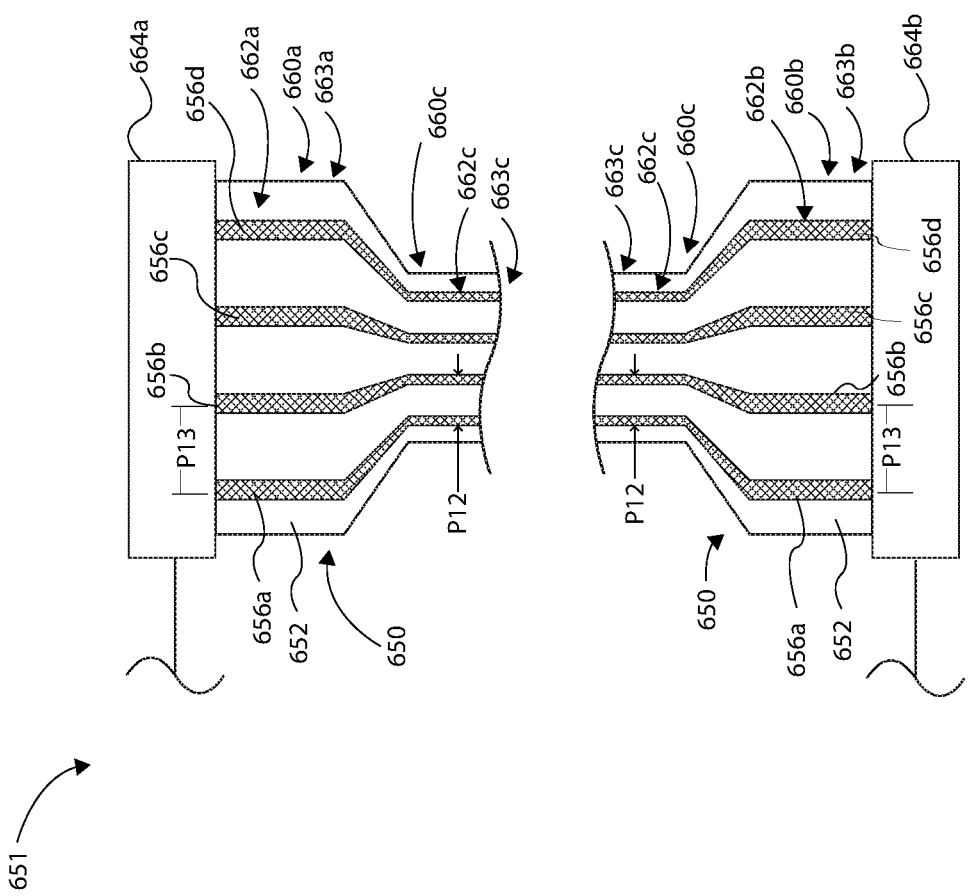
FIG. 6B graphically illustrates an electronics assembly having a conductive interconnect structure in accordance with an example of the present disclosure.

FIG. 6B shows another example of an electrically conducting assembly 651 comprising a conductive interconnect structure 650 that is somewhat formed in the inverse as compared to the conductive interconnect structure 600 described above with reference to FIG. 6A. More specifically, the conductive interconnect structure 650 can comprise a polymeric substrate 652 and embedded compliant conductive microstructures 656a-d supported by the polymeric substrate 652, which can have the example micro elements exemplified herein. As an overview, the polymeric substrate 652 can comprise a first end portion 660a and a second end portion 660b that have not been shrunken (or only slightly shrunken), while a middle portion 660c has been heated to shrink to increase an interconnect density that is greater or higher than an interconnect density of the end portions 660a and 660b.

More particularly, a middle section 662c of the compliant conductive structures 656a-d associated with the middle portion 660c of the polymeric substrate 652 can define a first interconnect density defined by a first pitch P12, while an upper section 662a associated with the first end portion 660a defines a second interconnect density defined by a second pitch P13. Accordingly, the conductive interconnect structure 650 can comprise a first interconnect density region 663a, a second interconnect density region 663b, and a third interconnect density region 663c, as labeled and associated with respective sections 662a-c of the compliant conductive structures 656a-d.

The first end portion 660a can be mechanically coupled to a first electronics component 664a, while the upper section 662a of the compliant conductive structures 656a-d can be electrically coupled to the first electronics component 664a. On the other side, a lower section 662b of the compliant conductive structures 656a-d (at the second end portion 660b of the polymeric substrate 652) defines the second interconnect density defined by the second pitch P13. Note that FIG. 6B shows the upper and lower sections 662a and 662b as having the same pitches and interconnect densities, but they can be different to fit a particular pitch design, such as illustrated in FIG. 6A. The second end portion 660b can be mechanically coupled to a second electronics component 664b, while the lower section 662b of the plurality of compliant conductive structures 656a-d can be electrically coupled to the second electronics component 664b. The electronics components 664a and 664b can be any type of components, such as processors, power supplies, memory devices, etc. Thus, the first and third interconnect density regions can each define an interconnect density that is less than an interconnect density of the third density, because only the middle portion 660c has been heated and shrunk. Thus, the first and second interconnect density regions 663a and 663b can each define an interconnect density that is less than an interconnect density defined by the third interconnect density region 663c. And, as shown, the compliant conductive structures 656a-d can extend through each of the first, second, and third density regions 663a-c in a continuous manner without breaks, splices, or other transitions.

In one example, opposing ends of the conductive interconnect structure 650 can be electrically conductive microstructures or traces having a pitch sized to match the pins (or pitch) of the coupled electronics component 664a or 664b (or connector), and that each flare inwardly toward the middle portion 660c of the polymeric substrate 652. This can be achieved by selectively heating only the middle portion 660c of the polymeric substrate 652, similarly as described above regarding FIGS. 5A and 5B. Thus, the middle portion 660c can be shrunk down to a particular size and shape (depending on the reliability of the compliant conductive structures 656a-d) about the middle portion 660c. Such selective shrinkage and tailoring of the middle portion 660c can be advantageous because cables, such as ribbon cables, are normally shielded with a shielding material during manufacture, but because the middle portion 660c has been shrunken down, the shielding material that would be required to cover or shield the middle portion 660c is significantly reduced. This also reduces any possible transitions or splicing of the conductive structures 656a-d that would normally be required when generating or fabricating a middle section that is smaller (more densely pitched) than end sections of a particular cable, for instance.

Moreover, such tailored shrinkage of the middle portion 660c can be performed "on the fly" and after fabrication of an (unshrunk) polymeric substrate. For example, end portions 660a and 660b can be coupled to respective electronic components 664a and 664b in the field, and then the middle portion 660c can be heated to shrink to a desired size while in the field (e.g., after a "blank" or unshrunk conductive interconnect structure has been fabricated). That is, a particular conductive interconnect structure can be manufactured having the same (unshrunk) cross sectional size and shape along the entire length of the conductive interconnect structure (e.g., FIG. 1A), thereby forming a uniform ribbon cable ready for distributions, sale, and use in the field, for instance. Then, a technician can couple end portions 660a and 660b to respective electronic devices, as described above, and then selectively heat the middle portion 660c to shrink it, thereby modifying or altering the manufactured size and shape of the ribbon cable, for instance. This can dramatically reduce manufacture and assembly costs, and can provide a variety of customizable ribbon lines that can be heated at desired locations to fit a particular purpose.

As a further advantage, the amount of losses have been minimized or reduced that would normally exist with transitions and splicing of a ribbon cable, which is not required with the conductive interconnect structures 600 and 650 because they are each one continuous body comprised of a single piece of polymeric substrate, and having attached microstructures that extend all the way through the single piece of polymeric substrate. Additionally, by changing the interconnect density of the compliant conductive structures 656a-d about the middle section 662c in this manner, the impedance of the compliant conductive structures 656a-d has been changed or modified, which helps to reduce or minimize cross-talk to meet the requirements of a particular electronics assembly.

It is noted herein, that the polymeric substrates discussed in the examples herein can comprise a single piece of material, or a plurality of components or pieces.

FIGS. 7A and 7B graphically illustrate a method of making a conductive interconnect structure 700 to increase an interconnect density of compliant conductive microstructures of the conductive interconnect structure 700 in accordance with one example of the present disclosure. The conductive interconnect structure 700 can comprise a polymeric substrate 702 having a selected portion 710 that is shrinkable to transition from an unshrunk state (FIG. 7A) to a shrunken state (FIG. 7B) in response to the application of heat from a heat source 704. The conductive interconnect structure 700 can comprise a plurality of compliant conductive microstructures 706a-d attached to the polymeric substrate 702 (such as described regarding FIGS. 2 and 3), and can each comprise the micro elements as exemplified herein.

When in the unshrunk state of FIG. 7A, the plurality of compliant conductive microstructures 706a-d can define a first interconnect density defined by a first pitch P14 between adjacent compliant conductive microstructures 706a-d. The first pitch P14, as specifically labeled between conductive microstructures 706b and 706c, can be as desired, such as approximately 200 microns (or more or less). Similarly as described regarding FIGS. 1A and 1B, because the polymeric substrate 702 is shrinkable to a certain degree in response to the application of heat from the heat source 704, the selected portion 710 of the polymeric substrate 702 can be heated to a selected temperature and duration to shrink it to a desired size, for example, to at least half its original size and shape.

A first side 720a of the polymeric substrate 702 can be constrained about a first region 722a along its length, while an opposing second side 720b can be constrained about a second region 722b. Constraint devices, such as clamps or platens or other constraint devices or mechanisms or systems, can be used to achieve such constraint about the first and second sides 720a and 720b. Notably, as the selected portion 710 is heated and shrunken to a desired size, only the upper sections 712a of the compliant conductive microstructures 706b and 706c (associated with the heated/selected portion 710) move closer together, thereby defining a second interconnect density defined by a second pitch P15 (e.g., 70 microns or less) between the upper section 712a of the compliant conductive microstructures 706b and 706c. Meanwhile, because the first and second sides 720a and 720b are constrained, the compliant conductive microstructures 706a and 706d do not move from their original positions, so that a lower section 712b of the compliant conductive microstructures 706a-d maintains the same first pitch P14 after being heated. Constraining the sides of the polymeric substrate 702 in this manner causes greater shrinkage force about the central area of the polymeric substrate 702 that is heated, which causes even further or greater shrinkage and pitch reduction (and increased interconnect density) than without constraining portions of the polymeric substrate 702.

Thus, the upper section 712a of the compliant conductive microstructures 706b and 706c define a first density region 713a that has an interconnect density that is greater or higher than an interconnect density of a second density region 713b. Note that the first density region 713a has a very low interconnect density, because the area of the polymeric substrate 702 has remained the same area, but the amount of conductive microstructures 706b and 706c has decreased. Moreover, the compliant conductive microstructures 706b and 706c extend continuously through each of the first and second density regions 713a and 713b. This conductive interconnect structure 700 of FIG. 7B can be advantageous in applications of electrically conductive cable lines, such as flexible BUS lines, where the upper section 712a can be electrically and mechanically coupled to an electrical component, such as a processor, while the lower section 712b can be electrically and mechanically coupled to at least one electrical component, such as back-end electrical components (e.g., power supply, larger electronics components, memory devices, etc.). This can be useful for a bus port that addresses a high density of interconnect structures, such as a microprocessor and an another adjacent component that does not require such a high density of pins. Prior systems include cables that need to be spliced and interfaced with a connector that separates the cables into separate lines, or even with multiple buses that run the same path, which would add to the complexity of the cable and the space required for a given system.

FIGS. 8A and 8B graphically illustrate a method of making a conductive interconnect structure 800 to increase an interconnect density of compliant conductive microstructures of the conductive interconnect structure 800 in accordance with one example of the present disclosure. The conductive interconnect structure 800 can comprise a polymeric substrate 802 that is shrinkable to transition from an unshrunk state (FIG. 8A) to a shrunken state (FIG. 8B) in response to the application of heat from a heat source 804. The conductive interconnect structure 800 can comprise a plurality of compliant conductive microstructures 806a-f attached to or embedded in the polymeric substrate 802. The plurality of compliant conductive microstructures 806a-f can each comprise a plurality or collection of micro elements, such as described herein.

In this example, the conductive interconnect structure 800 can be wrapped or draped around (or otherwise associated with) a curved surface 803 of a support body 805 (e.g., a curved surface being a non-planar surface). Note that the conductive interconnect structure 800 is shown as being spatially separated from the support structure 805 for purposes of illustration, but it may be interfaced or wrapped around the entire curved surface 803 prior to being heated and shrunken. The curved surface 803 can be curvilinear, or have a variable curved surface, and even some planar surface areas between curved surface areas.

When in the unshrunk state of FIG. 8A, the plurality of compliant conductive microstructures 806a-f define a first interconnect density defined by a first pitch P16 between adjacent compliant conductive microstructures 806a-f. The compliant conductive microstructures 806a-f can be arranged in any manner (e.g., linearly) and they can be spatially separated from each other. Although one particular layout is shown, other layouts or configurations are contemplated, such as those that are variably separated, or those comprising pitched conductive microstructures, or even those with the microstructures arranged in a grid pattern such as shown in FIG. 4A.

Because the polymeric substrate 802 is shrinkable to a certain degree in response to the application of heat from the heat source 804, the polymeric substrate 802 can be heated to a selected temperature and duration to shrink it to some degree. Notably, as the polymeric substrate 802 is heated and shrunken to a desired size, the compliant conductive microstructures 806a-f are caused to concurrently move closer together upon being strained by the shrinking polymeric substrate 802, thereby increasing the interconnect density of the compliant conductive microstructures 806a-f. This is because the compliant conductive microstructures 806a-f can be a plurality micro elements, as discussed above, that can slide or move relative to each other without buckling or breaking while the polymeric substrate is shrunken, even when radially being strained about the curved surface 803.

Therefore, in response to applying heat to the entire polymeric substrate 802 in the example of FIG. 8A, the polymeric substrate 802 will uniformly shrink and set to a final shape and size (e.g., one that may be half its original size), such that the compliant conductive microstructures 806a-f move closer together radially while the polymeric substrate 802 conforms or form-fits to the shape of the curved surface 803, thereby defining a second interconnect density that is greater or higher than the first interconnect density. The second interconnect density is therefore defined by a second pitch P17 that is less than the first pitch P16. Thus, the compliant conductive microstructures 806a-f have somewhat been transferred to, or become part of, the curved surface 803 of the support body 805. As a result, the polymeric substrate 802 can comprise at least one curved surface supporting one or more of the compliant conductive microstructures 806a-f.

In some examples, the support body 805 can be a rigid structure, such as a structure or body comprised of a composite material, a metallic material, a glass material, a ceramic material, an inorganic material, and other structures or bodies that can carry or support a conductive interconnect microstructure of the present disclosure.

In another example, one or more selected portions of the polymeric substrate 802 can be selectively heated at to increase the interconnect density associated with such selected portions, thereby increasing the current carrying capacity at those selected portions about a particular curved surface or surfaces.

The capability of applying or attaching the conductive interconnect structure 800 to a curved or radial surface provides the advantage of reducing space required to run cables in a system, because the cable is now conformal to the surface, thereby reducing system complexity and maximizing space needed. This is very time consuming and costly to achieve with traditional lithography devices because of the complexity with forming traces on a curved surface, which is often not feasible or efficient for a number of applications.

Some applications of attaching a conductive interconnect structure to a curved body or curved component, can include, but are not limited to, attaching or wrapping the conductive interconnect structure to a curved surface (e.g., glass) of a vehicle, such as an automobile, aircraft, vessel, spacecraft, electronics component, and the like. Other particular applications include windshield defoggers.

In another example, the support body 805 could be a removable or disposable body, such as a flowable mold (or a removable structure such as a rod), that could be removed after the conductive interconnect structure 800 has been heated and conformed to the shape of the support body 805. The polymeric substrate and underlying structure (e.g., rod) can be tuned to have amounts of adhesion, depending on the heating required and the materials used. Thus, the polymeric substrate 802 would remain having the shape of the removed support body 805. This could be useful in applications where a middle section (e.g., 660c of FIG. 6B) could be wrapped around a long rod while heating and shrinking the middle section, and then removing the long rod, so that the middle section is somewhat spiraled in shape. Thus, the cross-sectional area and space required for the BUS cable has been further decreased, which also makes it easier to shield such middle section because of its spiraled, circular geometry (as compared to a flat cable).

FIGS. 9A-9C graphically illustrate a method of making a conductive interconnect structure 900 to increase an interconnect density of compliant conductive microstructures of the conductive interconnect structure 900 in accordance with one example of the present disclosure. The conductive interconnect structure 900 can comprise a polymeric substrate 902 shrinkable to transition from an unshrunk state (FIG. 9B) to a shrunken state (FIG. 9C) in response to the application of heat from a heat source 904. The conductive interconnect structure 900 can comprise a plurality of compliant conductive microstructures 906a-f attached to or embedded in the polymeric substrate 902, which can each comprise a plurality of micro elements, such as described herein.

The conductive interconnect structure 900 can be wrapped or draped around (or otherwise positioned around) a multi-curved surface configuration 903 of a support body 905. The multi-curved surface configuration 903 can comprise a first curved surface 907a and a second curved surface 907b separated by a transition curved surface 907c. The multi-curved surface configuration 903 can be similarly shaped as a symmetrically curved cone, specifically an upper section defined by the first curved surface 907a is formed having a smaller cross sectional area (or diameter) than a lower section defined by the second curved surface 907b.

Note that the conductive interconnect structure 900 is shown as being spatially separated from the support structure 905, but it could be interfaced to or wrapped around the double-curved surface configuration 903 prior to being heated and shrunk. As shown in FIG. 9B, the conductive interconnect structure 900 could be formed to a shape that corresponds to the shape of the support structure 905, or it could be formed to be generally cylindrical in shape, similar to the conductive interconnect structure 800 shown in FIG. 8A. Alternatively, the conductive interconnect structure 900 could be a flat, flexible panel or film that can be wrapped or draped around some or all of the support body 905.

When in the unshrunk state of FIG. 9B, the plurality of compliant conductive microstructures 906a-f define a first interconnect density defined by a first pitch P18 between adjacent compliant conductive microstructures 906a-f. The plurality of compliant conductive microstructures 906a-f can be arranged spatially separated from each other, as shown, although other configurations or layouts are contemplated, as discussed herein.

Because the polymeric substrate 902 is shrinkable to a certain degree in response to the application of heat from the heat source 904, a first end portion 910a can be selectively heated to a temperature and duration (as indicated by box H1) to shrink it to a desired size and shape. As the first end portion 910a of the polymeric substrate 902 is heated and shrunken to a desired size, an upper section 912a of the compliant conductive microstructures 906a-f can concurrently move closer together while the first end portion 910a conforms or form-fits to the first curved surface 907a. In addition, a lower end portion 910b of the polymeric substrate 902 can be heated (as indicated by box H2) to shrink it to a desired size and shape. As the first end portion 910a of the polymeric substrate 902 is heated and shrunken to a desired size, an upper section 912a of the compliant conductive microstructures 906a-f can concurrently move closer together while the first end portion 910a conforms or form-fits to the first curved surface 907a. In addition, a second end portion 910b of the polymeric substrate 902 can be heated (as indicated by box H2) and shrunken to a different desired size such that a lower section 912b of the compliant conductive microstructures 906a-f can concurrently move closer together while the second end portion 910b conforms or form-fits around the second curved surface 907b. The heating of the first and second end portions 910a and 910b causes a third portion 910c of the polymeric substrate 902 and a middle portion 912c of the compliant conductive microstructures 906a-f to likewise conform to the transition curved surface 907c.

Therefore, in response to applying selected heat applications to each of the first and second end portions 910a and 910b of the polymeric substrate 902, as illustrated in FIG. 9B, the polymeric substrate 902 will shrink and conform or form-fit to the multi-curve surface configuration 903 of the support body 905. In this manner, the lower sections 912b of the compliant conductive microstructures 906a-f move closer together radially about the shape of the second curved surface 907b, thereby defining a second interconnect density defined by a second pitch P19, which can be less than the first pitch P18. And, the upper sections 912a of the compliant conductive microstructures 906a-f also move closer together radially about the shape of the first curved surface 907a, as extending from the third curved surface 907c in a curve-like manner, thereby defining a third interconnect density defined by a third pitch P20, which can be less than the first pitch P18 (and also less than the second pitch P19). As a result, the polymeric substrate 902 can comprise a first curved profile (i.e., the first end portion 910a), and a second curved profile (i.e., the second end portion 910b), which is different from the first curved profile.

Therefore, the conductive interconnect structure 900 of FIG. 9C includes a first density region 913a associated with the first section 912a and a second density region 913b associated with the second section 912b of the compliant conductive microstructures 906a-f. A third density region 913c is defined between the first and second density regions 913a and 913b, and is defined by the third section 912c of the compliant conductive microstructures 906a-f. Therefore, the compliant conductive structures 906a-f can extend through each of the first, second, and third density regions 913a-c in a continuous manner, and in a curve-like manner longitudinally, and radially around the shape of the support body 905.

In one particular example, the first pitch P18 can be initially about 200 microns prior to heating, while after heating the third pitch P20 can be formed to be 10 microns. Meanwhile, the second pitch P19 can be formed to be 70 microns, for instance. Thus, the compliant conductive microstructures 906a-f of the first section 912a and the second section 912b can have very fine pitches between each other without buckling or cracking while the polymeric substrate is shrunk, which provides a high-density interconnect structure capable of transferring electrical energy and/or thermal energy at a much higher density as compared to conductive traces with a higher pitch value formed via photolithography, for instance.

The capability of applying or attaching a conductive interconnect structure to a multi-curved surface configuration provides the advantage of patterning and adhering electromagnetic interacting structures (i.e., conductive microstructures 906a-f) to selected surfaces, such as relatively large curved structures or bodies (e.g., vehicles, aircraft, etc.).

One application of this example conductive interconnect structure 900 includes attaching the first section 912a of the compliant conductive microstructures 906a-f to an electronics component (not shown) that can benefit from such finely and densely pitched electrically conductive traces or wires, such as a microprocessor. At the second section 912b, a number of other electronics components (e.g., back-end electronics, power supply) can be electrically coupled to the compliant conductive microstructures 906a-f, thereby electrically coupling such components to the microprocessor, in one example.

FIG. 10 shows one such example of an electrically conducting assembly 951 that can utilize the structure and operations discussed regarding the conductive interconnect structure 900 of FIG. 9C. Here, the electronics assembly 951 can comprise a conductive interconnect structure 950 that comprises a polymeric substrate 952 and a plurality of compliant conductive microstructures 956a-f attached to the polymeric substrate 952, such as described with reference to FIGS. 9A-9C.

Here, an upper section 962a of the compliant conductive microstructures 956a-f can be electrically coupled to a first electronics component 964a that can benefit from such finely and densely pitched electrically conductive traces or wires, such as a microprocessor. A lower section 962b of one or more compliant conductive microstructures 956c and 956d can be electrically coupled to a second electronics component 964b, such as a number of other electronics components (e.g., back-end electronics, power supply), thereby electrically coupling the first electronics component 964a to the second electronics component 964b.

Shrinkage of a polymer substrate to conform or form-fit to a surface can also allow for embedding the compliant conductive microstructures into a material stack-up, such as a stack of dies of a semiconductor, or of another integrated circuit, printed electronics device, flexible cable, and/or electronics assembly, whether being rigid, semi-rigid, or flexible. For instance, a conductive interconnect structure could be wrapped and form fit around a portion of a system (as described above), and then a form-fitted metallic shield or other material deposit can be overlaid onto the first conductive interconnect structure to act as a shield (or another thin structural layer could be form-fitted around the first conductive interconnect structure). Therefore, a number of other layer of material can be deposited on top of a form-fitted conductive interconnect structure to suit a particular purpose.

In other examples, a particular polymer substrate (such as any discussed herein) can act as a "carrier" where a light-heat exposure permits tailoring of a pattern (by shielding selective portions of the polymer substrate for selective heating) of compliant conductive microstructures, while a "hotter" exposure from a heat source conforms or form-fits the pattern of the compliant conductive microstructures to a support body or surface. Then, the polymeric substrate may be removed once the features of the compliant conductive microstructures are affixed to the surface.

There are a variety of factors that can be varied depending upon the particular intended application of use of one or more conductive interconnect structures as taught herein. For instance, variables include the conductivity of the compliant conductive microstructures, the desired "starting" pitch and "finishing" pitch, the type of polymeric material required (having a particular negative CTE or shrinkage value), the temperature and duration of applied heat, the pitch required by a particular connector/connection to a structure or electronics component, and other application-specific factors that may exist. The polymeric substrates discussed herein could be selected from a number of available thermoplastics, such as polycarbonate, acetyl copolymer polyoxymethylene, acetal homopolymer polyoxymethylene, acrylic, nylon, polyethylene, polypropylene, polystyrene, etc. And, the compliant conductive microstructures discussed herein could be selected from a number of electrically and thermally conductive fibers, such as carbon nanofibers, polymer nanofibers, etc., and which can be doped with a variety of electrically conductive material, such as gold, silver, acid (when etching), etc. Note that controlling the conductive nature of particular nanostructures, for instance, can be controlled by inclusion of certain metals and their deposition (or etching) and implantation of other materials (e.g., gold, silver).

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The user of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A conductive interconnect structure, comprising:
   a polymeric substrate shrinkable from an unshrunk state to a shrunken state; and
   a plurality of compliant conductive microstructures attached to the polymeric substrate, each compliant conductive microstructure comprising a plurality of micro elements,
   wherein, in response to selective application of heat, at least a portion of the polymeric substrate transitions from the unshrunk state to the shrunken state to increase an interconnect density of the plurality of compliant conductive microstructures, and
   wherein an unshrunk portion of the polymeric substrate defines a first interconnect density region, and wherein a shrunk portion of the polymeric substrate defines a second interconnect density region, wherein a first section of the compliant conductive microstructures associated with the first interconnect density region extend continuously to a second section of the compliant conductive microstructures associated with the second interconnect density region.

2. The conductive interconnect structure of claim 1, wherein the plurality of micro elements comprises a plurality of compliant conductive nanofibers, and wherein the polymeric substrate comprises a thermoplastic material.

3. The conductive interconnect structure of claim 1, wherein the plurality of compliant conductive microstructures is arranged in a grid pattern.

4. The conductive interconnect structure of claim 1, wherein at least some of the compliant conductive microstructures define a first pitch when in the shrunken state, and wherein, when in the unshrunk state, at least some of the compliant conductive microstructures define a second pitch, the first pitch being less than the second pitch.

5. The conductive interconnect structure of claim 4, wherein the polymeric material is comprised of a thermoplastic material that is shrinkable to a fraction of its unshrunk size in response to the application of heat.

6. The conductive interconnect structure of claim 1, wherein a first portion of the polymeric substrate comprises a first curved profile, and wherein a second portion of the polymeric substrate comprises a second curved profile different from the first curved profile.

7. The conductive interconnect structure of claim 1, wherein the polymeric substrate is formed from a polymeric film and a polymeric base substrate that embed the compliant conductive microstructures.

8. The conductive interconnect structure of claim 1, wherein a first end portion of the conductive interconnect structure defines a first interconnect density and is coupleable to a first electronics component, a second end portion of the conductive interconnect structure defines a second interconnect density and is coupleable to a second electronics component, and a middle portion of the conductive interconnect structure defined between the first and second end portions comprises a third interconnect density, and wherein the first and second interconnect densities are each higher than the third interconnect density.

9. An electrical conducting assembly, comprising:
a support body comprising a support surface;
a conductive interconnect structure carried by the support body about the support surface,
the conductive interconnect structure comprising:
a polymeric substrate shrinkable from an unshrunk state to a shrunken state; and
a plurality of compliant conductive microstructures attached to the polymeric substrate, each conductive microstructure comprising a plurality of micro elements,
wherein, in response to selective application of heat, at least a portion of the polymeric substrate transitions from the unshrunk state to the shrunken state to increase an interconnect density of the plurality of compliant conductive microstructures, thereby conforming the conductive interconnect structure to the support surface of the support body, and
wherein an unshrunk portion of the polymeric substrate defines a first interconnect density region, and wherein a shrunk portion of the polymeric substrate defines a second interconnect density region, wherein a first section of the compliant conductive microstructures associated with the first interconnect density region extend continuously to a second section of the compliant conductive microstructures associated with the second interconnect density region.

10. The assembly of claim 9, wherein the plurality of micro elements comprises a plurality of compliant conductive nanofibers, and wherein the polymeric substrate comprises a thermoplastic material, the thermoplastic material configured to shrink to a fraction its original shape and size in response to the application of heat.

11. The assembly of claim 9, wherein the plurality of compliant conductive microstructures are arranged in a grid pattern, wherein at least a portion of the support surface comprises a curved surface.

12. The assembly of claim 9, wherein the support body comprises a first curved support surface and a second curved support surface, wherein a first section of the compliant conductive microstructures is conformed to the first curved support surface, and wherein a second section of the compliant conductive microstructures is conformed to the second curved support surface, wherein the first section comprises an interconnect density that is higher than an interconnect density of the second section.

13. The assembly of claim 12, wherein the first section of the compliant conductive microstructures is electrically coupled to a processor, and wherein the second section of compliant conductive microstructures is electrically coupled to at least one electronics component.

14. The assembly of claim 9, wherein a first section of the compliant conductive microstructures define a first pitch and is coupled to a first electronics component, and wherein a second section of the compliant conductive microstructures define a second pitch and is coupled to a second electronics component, and wherein a middle section of the compliant conductive microstructures defined between the first and second sections comprises a third pitch, wherein the first and second pitches are each less than the third pitch.

15. The assembly of claim 9, wherein a first section of the compliant conductive microstructures defines a first pitch and is coupled to a first electronics component, wherein a second section of the compliant conductive microstructures defines a second pitch and is coupled to a second electronics component, and wherein a middle section of the compliant conductive microstructures defined between the first and second sections defines a third pitch, wherein the first and second pitches are each higher than the third pitch.

* * * * *